Figure 1:
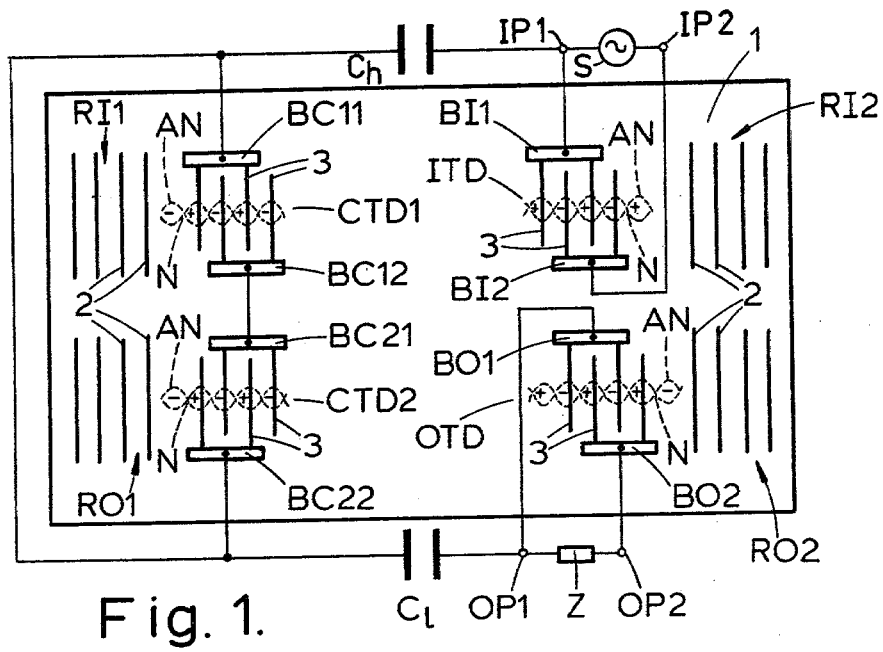

United States Patent [19]

Redwood et al.

[11] 4,247,836
[45] Jan. 27, 1981

[54] ACOUSTIC WAVE DEVICES

[75] Inventors: Martin Redwood, Sevenoaks; Frederick W. Smith, Sutton; Richard F. Mitchell, Merstham, all of England

[73] Assignee: U.S. Philips Corporation, New York, N.Y.

[21] Appl. No.: 13,951

[22] Filed: Feb. 22, 1979
(Under 37 CFR 1.47)

[30] Foreign Application Priority Data

Feb. 23, 1978 [GB] United Kingdom ............... 07263/78

[51] Int. Cl.³ .................. H03H 9/25; H03H 9/64; H03H 9/145; H01L 41/04
[52] U.S. Cl. ................................. 333/195; 333/194; 333/196

[58] Field of Search .................. 333/150–155, 333/193–196; 310/313; 331/107 A; 29/25.35

[56] References Cited

U.S. PATENT DOCUMENTS 3,886,504  5/1975  Hartmann et al. ............... 333/195

Primary Examiner—Marvin L. Nussbaum
Attorney, Agent, or Firm—William J. Streeter; Bernard Franzblau

[57] ABSTRACT

An acoustic wave resonator device includes two pairs of coupled spaced apart reflectors which define two resonant cavities. The two cavities are each provided with two interdigital transducers which provide intercavity coupling. Additional reactance coupling between the transducers in one cavity combines with the equivalent cavity reactance to provide series or parallel resonance at a selected pole frequency.

12 Claims, 10 Drawing Figures

ACOUSTIC WAVE DEVICES

This invention relates to coupled acoustic wave resonator devices having a filter passband centred on a predetermined frequency, the device including a substrate able to propagate acoustic waves, two pairs of spaced apart reflectors, each pair of reflectors forming one of two resonant cavities each capable of supporting an acoustic standing wave in the substrate at said predetermined frequency at which that cavity has a series resonant equivalent circuit, two interdigital transducers disposed on a surface of the substrate in each cavity for coupling with acoustic standing wave energy, and means connecting one of said transducers in one cavity with one of said transducers in the other cavity to thereby couple the two cavities.

Devices of the above type are known, for example from the article by G. L. Matthei et al, "A study of the properties and potential applications of acoustic-surface-wave resonators" in 1975 Ultrasonics Symposium Proceedings (IEEE Publication 75CHO 994-4SU), pages 295–298, September 1975. In this article it is stated that "In most band-pass filter applications one would want to use multiple resonators in order to obtain the desired rate of cut-off, and in the case of two-port surface-wave resonators, in order to get the desired amount of stop-band attenuation."

An object of the present invention is to provide a device of the above known type in which the amount of stop-band attenuation achieved by using a given number of resonators is increased at a selected frequency by the formation of an attenuation pole at that selected frequency.

According to the invention there is provided a coupled acoustic wave resonator device of the known type described in the opening paragraph of this specification, characterized in that each said transducer includes two sets of electrodes, the electrodes of each set being electrically connected in common and the two sets of electrodes of each transducer being disposed for coupling to opposite phases of acoustic standing wave energy at said predetermined frequency, and in that a capacitance having a selected value is provided between a selected pair of said sets of electrodes in the same selected one of said cavities, one set of said pair being selected from each transducer in that cavity, for forming an attenuation pole at a selected pole frequency on one side of said predetermined frequency. In the case where that pole frequency is on the high frequency side of said predetermined frequency the selected pair of sets of electrodes is coupled to the same phase of acoustic standing wave energy at said predetermined frequency whereby said capacitance forms a parallel resonant circuit with the equivalent circuit inductance of that cavity at that pole frequency. In the case where that pole frequency is on the low frequency side of said predetermined frequency the selected pair of sets of electrodes being coupled to opposite phases of acoustic standing wave energy at said predetermined frequency whereby the equivalent resonant inductance of said capacitance at that pole frequency forms a parallel resonant circuit with the equivalent circuit capacitance of that cavity at that pole frequency.

The invention is based on the realisation that in the devices of the known type the series resonant equivalent circuit of each cavity is independently accessible for the formation of an attenuation pole by provision of a reactance between the two transducers in that cavity, and that furthermore the reactance may be a capacitance both on the one hand for the formation of a high frequency attenuation pole by providing that capacitance between sets of electrodes coupled to the same phase of acoustic standing wave energy and also on the other hand for the formation of a low frequency attenuation pole by providing that capacitance between sets of electrodes coupled to opposite phases of acoustic standing wave energy, in which case the antiphase equivalent inductance of the capacitance is effective to form the low frequency attenuation pole.

The choice of the two sets of electrodes for the pair between which the selected capacitance acts to form an attenuation pole derives from an appreciation of the significance of the d.c. isolation between two interdigital transducers indicated by the two transformers in an equivalent circuit of an acoustic wave resonant cavity having two interdigital transducers in the cavity for coupling with acoustic standing wave energy, in which equivalent circuit each transducer may be represented by a capacitance coupled by an individual transformer to the series resonant circuit representing the cavity. The capacitance representing each transducer is the static capacitance between the two sets of electrodes forming that transducer, and those two sets of electrodes will be disposed for coupling to opposite phases of acoustic standing wave energy at the predetermined frequency of that standing wave. If the selected pair of sets of electrodes, one set from each transducer in the cavity, between which a selected capacitance is provided to form an attenuation pole are coupled to the same phase of acoustic standing wave energy at said predetermined frequency then the selected capacitance will be connected in parallel with the series resonant circuit representing the cavity. Thus the value of the selected capacitance may be chosen to form a parallel resonant circuit with the equivalent circuit inductance of the cavity at a selected pole frequency on the high frequency side of said predetermined frequency and thus forms an attenuation pole at that pole frequency. If, on the other hand, the selected pair of sets of electrodes, one set from each transducer in the cavity, between which a selected capacitance is provided to form an attenuation pole are coupled to opposite phases of acoustic standing wave energy at said predetermined frequency then, since the transducers in the cavity are d.c. isolated from each other as indicated by the two transformers in the equivalent circuit, a 180 degree phase shift is introduced into the current flowing through the selected capacitance such that the effect of the selected capacitance is approximately the same as that of an inductance of equivalent modulus of impedance connected between a pair of sets of electrodes, one set from each transducer in the cavity, which are coupled to the same phase of acoustic standing wave energy at said predetermined frequency. This equivalent inductance of the selected capacitance will be connected in parallel with the series resonant circuit representing the cavity. Thus the value of the selected capacitance may be chosen such that its equivalent resonant inductance forms a parallel resonant circuit with the equivalent circuit capacitance of the cavity at a selected pole frequency on the low frequency side of said predetermined frequency and thus forms an attenuation pole at that pole frequency.

The above-mentioned article by G. L. Matthei et al shows a simplified equivalent circuit of a one-port surface acoustic wave resonator, that is to say a cavity having a single transducer in which the transducer static capacitance is in shunt with a series resonant circuit equivalent of the cavity. The reactance characteristic of this circuit is shown as having a series resonant frequency $f_1$, an antiresonant frequency $f_2$ which is above but very close to $f_1$, and a relatively small reactance at frequencies away from $f_1$ and $f_2$. Both the closeness of the frequencies $f_1$ and $f_2$ and the small reactance away from them are stated to be undesirable. It is shown that adding a lumped-element shunt inductor to the resonator produces an additional antiresonant frequency below $f_1$ and also increases the spacing between $f_1$ and both antiresonant frequencies. However the use of a lumped inductor is stated to be undesirable, and the provision of a second transducer in the cavity to form a two-port resonator is then proposed as a preferable alternative. An equivalent circuit for the two-port resonator is shown which includes the static capacitance of each transducer coupled by an individual transformer to the series resonant circuit of the cavity. The overall reactance characteristic of this equivalent circuit is indicated to be a straight line through the resonant frequency with no antiresonant frequencies. The use of multiple two-port resonators for bandpass filter applications is then proposed.

Thus, although high and low frequency antiresonances are shown in the above-mentioned article by G. L. Matthei et al, these antiresonances are shown only in relation to one-port resonators which are then rejected in favour of two-port resonators where such antiresonances do not occur. Furthermore, although an equivalent circuit of a two-port resonator including a separate transformer coupling each transducer to the cavity is shown in this article, the significance of the d.c. isolation provided by those transformers is not discussed. It is therefore our opinion that, since antiresonances are rejected as undesirable in this article, a person skilled in the art is not led by the teaching of this article to the possibility of the provision of attenuation poles in bandpass filter applications of multiple two-port acoustic wave resonators. Furthermore, if a person skilled in the art independently arrived at a consideration of the possibility of such provision of attenuation poles then the discussion of the equivalent circuit including transformers in said article is not such as to make it obvious to such a person having regard to the teaching of this article that both high and low frequency attenuation poles can be independently provided by a capacitance according to the criteria prescribed by this invention.

According to one embodiment of the invention, said capacitance is provided by a capacitor located outside said selected one of said cavities and electrically connected between said selected pair of sets of electrodes. The advantage of this embodiment is that it does not impose any restriction on the configuration or disposition of the transducers in the cavities.

According to an alternative embodiment of the invention the configuration and disposition of the two transducers in said selected one of said cavities is such that said capacitance is provided by the capacitance existing between said selected pair of sets of electrodes. The advantage of this embodiment is that the need for an extra component in the form of an external discrete capacitor is avoided.

According to an embodiment of the invention a first said capacitance is provided between a selected pair of said sets of electrodes in one cavity for forming an attenuation pole immediately above the high frequency side of the filter passband and a second said capacitance is provided between a selected pair of said sets of electrodes in the other cavity for forming an attenuation pole immediately below the low frequency side of the filter passband. This embodiment provides an increase in the rate of cut-off on both sides of the filter passband and provides traps immediately adjacent the passband, which is particularly advantageous when the filter is required to select a narrow band communications channel and reject the immediately adjacent channels.

According to an embodiment of the invention, the device is a two-resonator device, the means connecting one of said transducers in one cavity with one of said transducers in the other cavity providing a direct electrical connection, the other said transducer in said one cavity being an input transducer for converting input electrical energy supplied to the device into acoustic wave energy, and the other said transducer in said other cavity being an output transducer for converting acoustic wave energy into output electrical energy supplied from the device. The advantage of this embodiment is that the stopband attenuation achieved by using only two coupled resonators, together with the increased attenuation provided by either or both of the attenuation poles according to the invention, may provide a satisfactory filter for a given application avoiding the need to otherwise use three or more coupled resonators.

In devices according to the invention the acoustic waves which the substrate is able to propagate may be surface acoustic waves propagating in the surface of the substrate on which the transducers and reflectors are disposed or they may be bulk acoustic waves propagating parallel and close to that surface of the substrate. The possible use of this type of bulk acoustic wave is mentioned in connection with delay line feedback oscillators in U.K. Pat. No. 1,451,326 and a range of rotated Y-cuts of quartz with propagation perpendicular to the X-axis suitable for this purpose is described in Electronics Letters, Mar. 3, 1977, Vol 13, No. 5 at pages 128 to 130.

Figure 2:
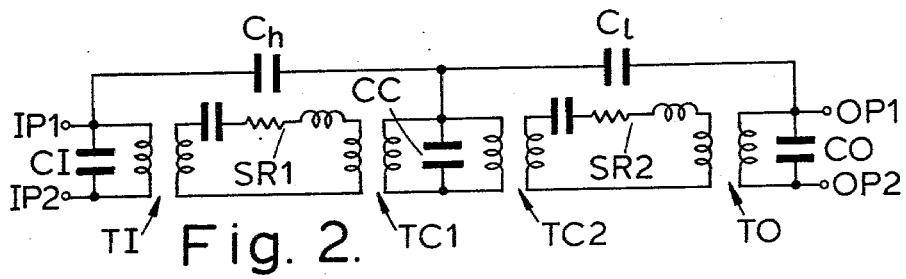
Figure 3:
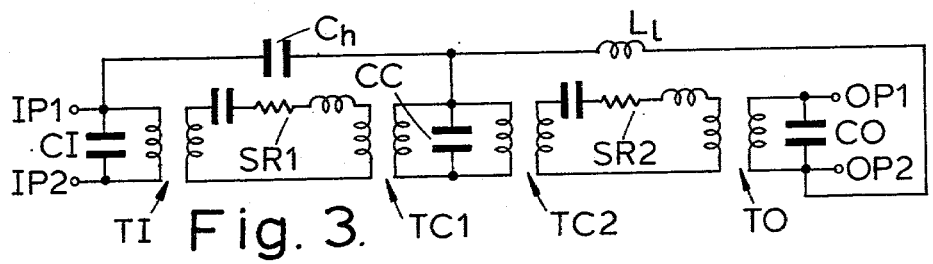
Figure 4:
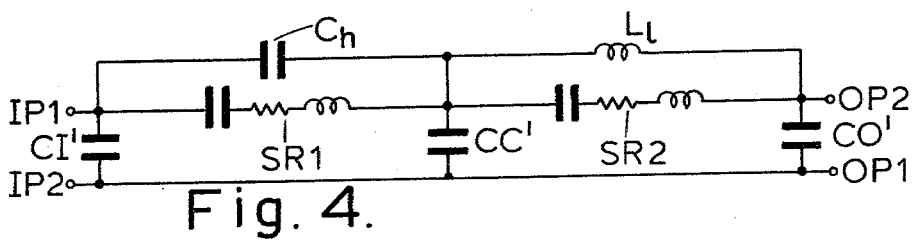
Figure 5:
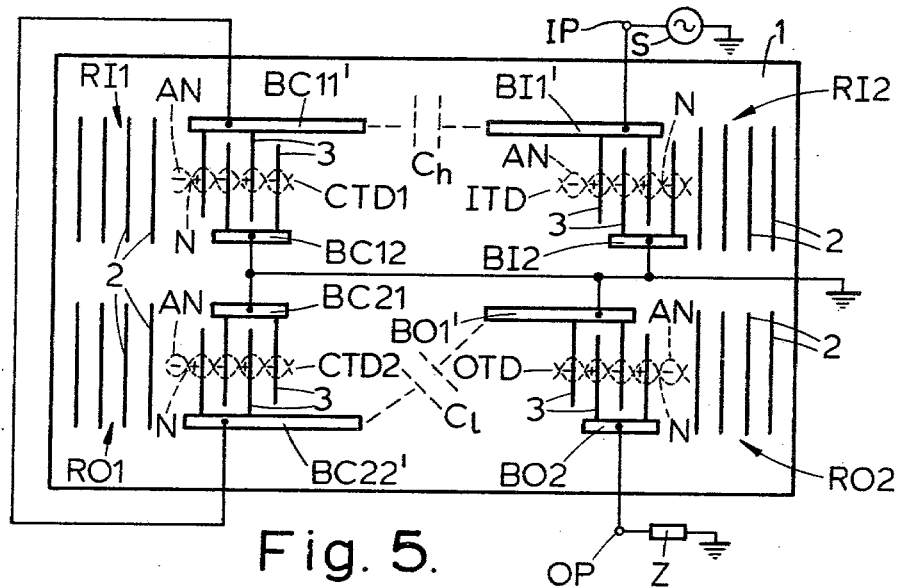
Figure 6:
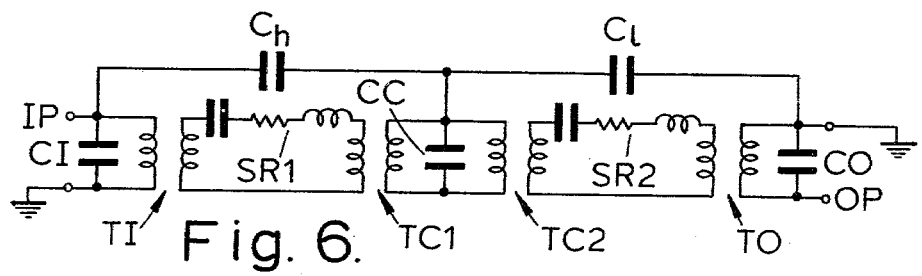
Figure 7:
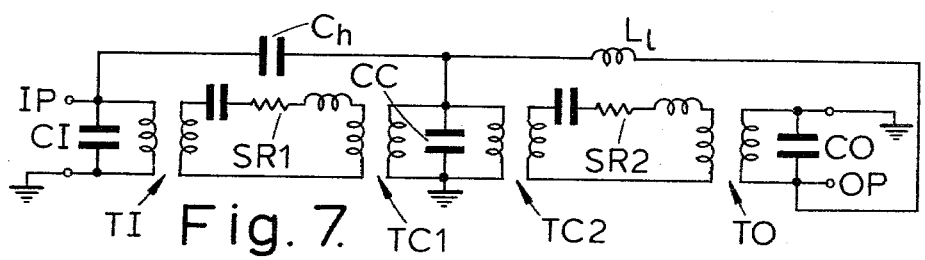
Figure 8:
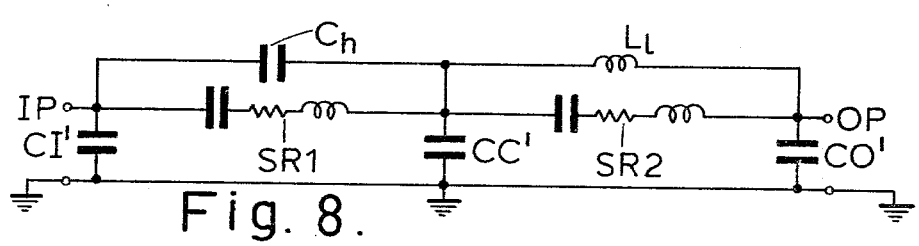
Figure 9:
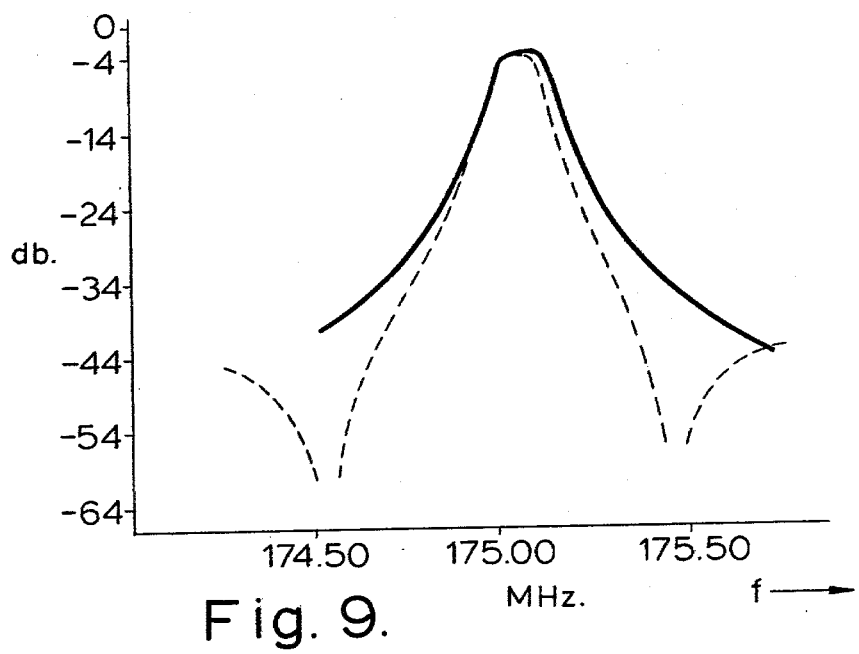
Figure 10:
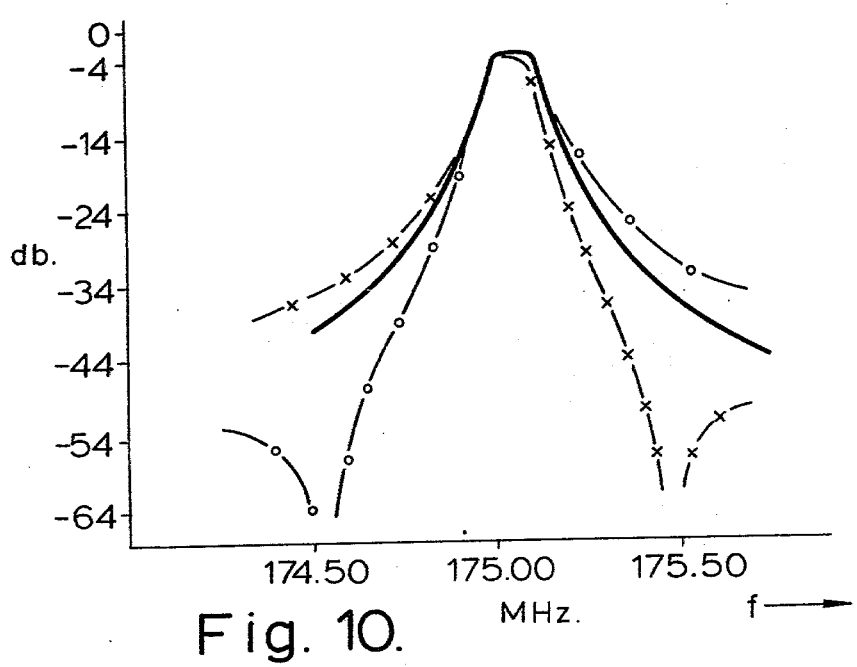

The invention will now be described in more detail with reference to the accompanying drawings, in which:

FIG. 1 is a schematic plan view of a coupled acoustic wave resonator device according to the invention, being a transducer coupled two-resonator device in which a high frequency attenuation pole is provided by a first capacitor connected between the transducers in one resonator and a low frequency attenuation pole is provided by a second capacitor connected between the transducers in the other resonator, FIG. 2 shows an equivalent circuit of the device of FIG. 1, in which the transducers are represented by capacitors, the cavities are represented by series-resonant circuits, and said transducer capacitors are coupled to said cavity series-resonant circuits by transformers, FIG. 3 shows another equivalent circuit of the device of FIG. 1, in which the second capacitor providing the low frequency attenuation pole is substituted by its antiphase equivalent inductance, FIG. 4 shows another equivalent circuit of the device of FIG. 1, including said antiphase equivalent inductance and in which the transformers are eliminated, FIG. 5 shows a schematic plan view of another transducer-coupled two-resonator device according to the invention, in which both high frequency and low frequency attenuation poles are provided by the capacitance existing between selected pairs of sets of electrodes of the transducers in the respective resonators, FIGS. 6, 7 and 8 show equivalent circuits of the device of FIG. 5 in the same manner as FIGS. 2, 3 and 4 respectively, FIG. 9 shows the predicted amplitude-frequency response, as a dotted line, of a device according to the invention having both high and low frequency attenuation poles, the solid line showing what the response would be without the attenuation poles, and FIG. 10 shows the predicted amplitude-frequency response, as a dash-cross line, of a device according to the invention having a high frequency attenuation pole only; and also the predicted amplitude-frequency response, as a dash-circle line, of a device according to the invention having a low frequency attenuation pole only; the solid line showing what the response would be without the attenuation poles.

Referring now to FIG. 1, there is shown in plan view a substrate 1 able to propagate acoustic waves. This substrate may be any well known piezoelectric substrate able to propagate surface acoustic waves in the surface shown, e.g. lithium niobate or quartz; or it may be a piezoelectric substrate able to propagate bulk acoustic waves parallel and close to the surface shown, e.g. a rotated Y-cut of quartz with propagation perpendicular to the X-axis as described in Electronics Letters, Mar. 3, 1977, Vol 13, No. 5 at pages 128 to 130. In the remainder of the description of this invention the substrate 1 will be assumed to be one of these two types and reference to acoustic waves will mean the appropriate surface acoustic waves or the particular type of bulk waves just described.

A first pair of spaced apart reflectors RI1 and RI2 forms a first resonant cavity capable of supporting an acoustic standing wave in the substrate 1 at a predetermined frequency $f_0$. A second pair of spaced apart reflectors RO1 and RO2 forms a second resonant cavity also capable of supporting an acoustic standing wave in the substrate 1 at the same frequency $f_0$. Each reflector RI1, RI2, RO1 and RO2 is a periodic grating structure comprising a plurality of discrete elements 2 at the surface 1. Each element 2 is a discontinuity, which may be for example a conductive strip on the surface or a groove in the surface, provided for reflecting a portion of acoustic wave energy incident thereon, and in a typical example each of the reflectors consists of 200 elements 2 having an effective spacing of half a wavelength $\lambda/2$ of acoustic waves at the frequency $f_0$. The first and second resonant cavities each have an effective length, greater than the distance between the nearest elements 2 of the respective pair of reflectors, which is substantially an integral number of half wavelengths at the frequency $f_0$. In the typical example just mentioned this effective length is 500$\lambda$ at a frequency $f_0$ which is 100 MHz including a distance of 400$\lambda$ between the nearest elements 2 of the respective pair of reflectors.

Two interdigital transducers ITD and CTD1 are disposed on the surface 1 in the first cavity, and two interdigital transducers CTD2 and OTD are disposed on the surface 1 in the second cavity, for coupling with acoustic standing wave energy. Each transducer includes two sets of electrodes 3, the electrodes of each set being electrically connected in common by a respective bus bar. Thus the transducer ITD includes a set of electrodes 3 connected by a bus bar BI1 and a set of electrodes 3 connected by a bus bar BI2, the transducer CTD1 includes a set of electrodes 3 connected by a bus bar BC11 and a set of electrodes 3 connected by a bus bar BC12, the transducer CTD2 includes a set of electrodes 3 connected by a bus bar BC21 and a set of electrodes 3 connected by a bus bar BC22 and the transducer OTD includes a set of electrodes 3 connected by a bus bar BO1 and a set of electrodes 3 connected by a bus bar BO2.

The acoustic standing wave resonance pattern in each cavity at the frequency $f_0$ will exhibit nodes and antinodes in acoustic stress and strain and also nodes and antinodes in electrical potential measured at the surface. The resonance patterns at the frequency $f_0$ at the locations of the interdigital transducers are shown in FIG. 1 and the nodes N and antinodes AN shown correspond to minima and maxima respectively of electrical potential measured at the surface. The positive and negative signs in FIG. 1 show the relative phases of acoustic standing wave energy at the frequency $f_0$ at a given instant. FIG. 1 shows all the electrodes 3 of the transducers located at antinodes AN of the acoustic standing wave patterns, and the two sets of electrodes of each transducer being disposed for coupling to opposite phases of acoustic standing wave energy at the frequency $f_0$.

The bus bars BI1 and BI2 are connected respectively to terminals IP1 and IP2 which are connected to a source of electrical energy S. The transducer ITD is thus an input transducer for converting input electrical energy supplied to the device into acoustic wave energy. The bus bars BO1 and BO2 are connected respectively to terminals OP1 and OP2 which are connected to a load Z. The transducer OTD is thus an output transducer for converting acoustic wave energy into output electrical energy supplied from the device. The bus bars BC11 and BC12 are directly electrically connected, and the bus bars BC12 and BC21 are directly electrically connected such that these electrical connections form means connecting the transducer CTD1 in the first cavity with the transducer CTD2 in the second cavity to thereby couple the two cavities. The coupled acoustic wave resonator device shown in FIG. 1 has a filter passband centred on the frequency $f_0$.

The capacitors $C_h$ and $C_l$ each independently form an attenuation pole in the filter response of the device shown in FIG. 1. Each of these capacitors is connected between a selected pair of the sets of electrodes 3 in the same cavity, one set of the pair being selected from each transducer in that cavity. The capacitor $C_h$ is connected between the set of electrodes 3 connected by the bus bar BI1 of the transducer ITD and the set of electrodes 3 connected by the bus bar BC11 of the transducer CTD1 in the first cavity. This selected pair of sets of electrodes is coupled to the same phase of acoustic standing wave energy at the frequency $f_0$. The capacitor $C_l$ is connected between the set of electrodes 3 connected by the bus bar BC22 of the transducer CTD2 and the set of electrodes 3 connected by the bus bar BO1 of the transducer OTD in the second cavity. This selected pair of sets of electrodes is coupled to opposite phases of acoustic standing wave energy at the frequency $f_0$. The capacitor $C_h$ forms an attenuation pole on the high frequency side of the frequency $f_0$, and the capacitor $C_l$ forms an attenuation pole on the low frequency side of the frequency $f_0$, as will now be explained with reference to FIGS. 2 to 5.

Referring now to FIG. 2, there is shown an equivalent circuit of the device of FIG. 1. The first and second cavities are represented by series resonant equivalent circuits SR1 and SR2 respectively. Each transducer is represented by a capacitance coupled by an individual transformer to the series resonant circuit representing the cavity in which it is located, this capacitance being the static capacitance between the two sets of electrodes forming that transducer. Thus a capacitance CI representing the input transducer ITD is coupled by a transformer TI to the series resonant circuit SR1, a capacitance CC representing the resonator coupling transducers CTD1 and CTD2 is coupled by a transformer TC1 to the series resonant circuit SR1 and by a transformer TC2 to the series resonant circuit SR2, and a capacitance CO representing the output transducer OTD is coupled by a transformer TO to the series resonant circuit SR2. The capacitor $C_h$ is connected between the electrode of the capacitance CI which is connected to the input terminal IP1 and one electrode of the capacitance CC, and the capacitor $C_l$ is connected between that same one electrode of the capacitance CC and the electrode of the capacitance CO which is connected to the output terminal OP1. The transformers TI and TC1 indicate the d.c. isolation between the transducers ITD and CTD1 in the first cavity represented by the capacitance CI and part of the capacitance CC respectively, and the transformers TC2 and TO indicate the d.c. isolation between the transducers CTD2 and OTD in the second cavity represented by part of the capacitance CC and the capacitance CO respectively. As a result of this d.c. isolation the effect of connecting the capacitor $C_l$ between a selected pair of sets of electrodes in the second cavity which are coupled to opposite phases of acoustic standing wave energy at the frequency $f_0$ is to introduce a 180 degree phase shift into the current flowing through the capacitor $C_l$ such that the effect of the capacitor $C_l$ is approximately the same as that of an inductance $L_l$ of equivalent modulus of impedance connected between a pair of sets of electrodes, one set from each transducer in the second cavity, which are coupled to the same phase of acoustic standing wave energy at the frequency $f_0$.

Referring now to FIG. 3, there is shown the same equivalent circuit as FIG. 2 with the modification that the capacitor $C_l$ is substituted by the above-mentioned antiphase equivalent inductance $L_l$ connected between the same common electrode of the capacitance CC to which the capacitor $C_l$ is connected in FIG. 2 and the electrode of the capacitance CO which is connected to the output terminal OP2.

Referring now to FIG. 4, there is shown another equivalent circuit of the device of FIG. 1 in which the transformers of FIGS. 2 and 3 are eliminated and the capacitances CI, CC and CO are replaced by capacitances CI', CC' and CO' to take account of this different form of circuit. The series resonant circuits SR1 and SR2 representing the first and second cavities have zero reactance at the resonant frequency $f_0$, a frequency dependent inductance at frequencies above the frequency $f_0$ and a frequency dependent capacitance at frequencies below the frequency $f_0$. The effect of connecting the capacitor $C_h$ between a pair of sets of electrodes, one from each transducer, in the first cavity which are coupled to the same phase of acoustic standing wave energy at the frequency $f_0$ is that the capacitor $C_h$ is connected in parallel with the series resonant circuit SR1 representing the first cavity. The value of the capacitor $C_h$ is chosen to form a parallel resonant circuit with the inductance of the circuit SR1 at a selected pole frequency above $f_0$ and hence an attenuation pole in the filter response of the device at that pole frequency. The effect of the capacitor $C_l$ being connected between a pair of sets of electrodes, one from each transducer, in the second cavity which are coupled to opposite phases of acoustic standing wave energy at the frequency $f_0$ is that the inductance $L_l$ is connected in parallel with the series resonant circuit SR2 representing the second cavity. The value of the capacitor $C_l$ is chosen such that its equivalent resonant inductance $L_l$ at a selected pole frequency below $f_0$ forms a parallel resonant circuit with the capacitance of the circuit SR2 at that selected pole frequency and hence an attenuation pole in the filter response of the device at that pole frequency.

Referring now to FIG. 5, there is shown a schematic plan view of another transducer-coupled two-resonator device which differs from the device of FIG. 1 essentially in that both high frequency and low frequency attenuation poles are provided by the capacitance existing between selected pairs of sets of electrodes in the respective resonator cavities and the configuration and disposition of the two transducers in each cavity is arranged to provide a selected value for that capacitance in each case. The high frequency attenuation pole is provided by the capacitance $C_h$ between the pair of sets of electrodes 3 connected respectively to the extended bus bar BT1' of the input transducer ITD and the extended bus bar BC11' of the coupling transducer CTD1 in the first cavity. The low frequency attenuation pole is provided by the capacitance $C_l$ between the pair of sets of electrodes 3 connected respectively to the extended bus bar BC22' of the coupling transducer CTD2 and the extended bus bar BO1' of the output transducer OTD in the second cavity. The other variation from FIG. 1 is that the bus bars BC12, BC21, BI2 and BO1' are electrically connected in common to ground potential, the bus bar BT1' is connected to a single input terminal IP of the device which is connected to the source S having its other terminal grounded, and the bus bar BO2 is connected to a single output terminal OP of the device which is connected to the load Z having its other terminal grounded.

FIGS. 6, 7 and 8 show equivalent circuits of the device of FIG. 5 in the same manner as FIGS. 2, 3 and 4 respectively.

On the one hand, an advantage of the device shown in FIG. 5 is that the need for an extra component in the form of an external discrete capacitor to provide each attenuation pole is avoided. On the other hand an advantage of the device shown in FIG. 1 is that restrictions on the configuration or disposition of the transducers in the cavities to enable the capacitance in the substrate between sets of electrodes of those transducers to provide each attenuation pole are avoided. Thus, in this latter case, the interdigital transducers need not each be of the strictly conventional configuration and disposition shown in FIG. 1, that is to say with all of the electrodes 3 of each set being regularly spaced at one wavelength of acoustic waves at the frequency $f_0$ and located on the antinodes of the standing wave pattern at that frequency. Examples of non-conventional interdigital transducers in this sense which may be employed in devices according to the invention are described in our U.S. Pat. Nos. 4,072,915 (Feb. 7, 1978) and 4,178,571 (Dec. 11, 1979) and U.K. patent application No. 41654/77 (PHB 32595).

Referring now to FIG. 9, the solid line shows a predicted band-pass filter amplitude-frequency response curve of a transducer-coupled two-resonator cavity acoustic surface wave device constructed in accordance with FIG. 1 or FIG. 5 but without the attenuation poles. The passband is centred on a frequency $f_0$ which is 175.00 MHz, the 3 db bandwidth is approximately 170 kHz and the stop-band response is approximately 35 db below the response at the centre frequency. The dotted line shows a predicted amplitude-frequency response curve of this device in which both high and low frequency attenuation poles are provided by capacitances $C_h$ and $C_l$ as shown in either FIG. 1 or FIG. 5. Both attenuation poles increase the stop-band attenuation at their respective selected pole frequencies by approximately 20 db and the 3 db bandwidth is reduced by approximately 40 KHz compared with the solid-line response. Thus an increase in the rate of cut-off is provided on both sides of the filter passband and traps are provided adjacent the passband, which is particularly advantageous when the filter is required to select a narrow band communications channel and reject the immediately adjacent channels.

Referring now to FIG. 10, the solid line shows the same amplitude-frequency response without attentuation poles as is shown by the solid line in FIG. 9. The dash-cross line shows the predicted amplitude-frequency response of the device having only a high frequency attenuation pole and produced by a capacitance $C_h$ arranged as shown in either FIG. 1 or FIG. 5. The dash-circle line shows the predicted amplitude-frequency response of the device having only a low frequency attenuation pole and produced by a capacitance $C_l$ arranged as shown in either FIG. 1 or FIG. 5.

The advantage of the two-resonator cavity devices shown in FIGS. 1 and 5 in which there is a direct electrical connection between the cavity coupling transducers CTD1 and CTD2 is that the stopband attenuation achieved by using only two coupled resonators, together with the increased attenuation provided by either or both of the attenuation poles, may provide a satisfactory filter for a given application avoiding the need to otherwise use three or more coupled resonators. However, the stop-band attenuation could be increased further by providings means for connecting the transducers CTD1 and CTD2 including at least a third intermediate cavity.

Although it is envisaged that attenuation poles provided by this invention are most useful at frequencies adjacent the filter passband of the acoustic wave device, they also can be produced at other selected pole frequencies on either side of the centre frequency of the filter passband.

What we claim is:

1. A coupled acoustic wave resonator device having a filter passband centred on a predetermined frequency comprising, a substrate able to propagate acoustic waves, two pairs of spaced apart reflectors with each pair of reflectors forming one of two resonant cavities each capable of supporting an acoustic standing wave in the substrate at said predetermined frequency at which that cavity exhibits a series resonant equivalent circuit, two interdigital transducers disposed on a surface of the substrate in each cavity for coupling with acoustic standing wave energy, means connecting one of said transducers in one cavity with one of said transducers in the other cavity to thereby couple the two cavities, each transducer including two sets of electrodes with the electrodes of each set being electrically connected in common and the two sets of electrodes of each transducer being disposed for coupling to opposite phases of acoustic standing wave energy at said predetermined frequency, a capacitance having a selected capacitance value provided between a selected pair of said sets of electrodes in the same one of said cavities, one set of said pair being selected from each transducer in that cavity, for forming an attenuation pole at a selected pole frequency on one side of said predetermined frequency, in the case where the selected pole frequency is on the high frequency side of said predetermined frequency the selected pair of sets of electrodes is coupled to the same phase of acoustic standing wave energy at said predetermined frequency whereby said capacitance forms a parallel resonant circuit with the equivalent circuit inductance of that cavity at that pole frequency, and in the case where the selected pole frequency is on the low frequency side of said predetermined frequency the selected pair of sets of electrodes is coupled to opposite phases of acoustic standing wave energy at said predetermined frequency whereby the equivalent resonant inductance of said capacitance at that pole frequency forms a parallel resonant circuit with the equivalent circuit capacitance of that cavity at that pole frequency.

2. A device as claimed in claim 1, wherein said capacitance comprises a capacitor located outside said selected one of said cavities and electrically connected between said selected pair of sets of electrodes.

3. A device as claimed in claim 1, wherein the configuration and disposition of the two transducers in a selected one of said cavities is arranged so that said capacitance is provided by the capacitance existing between said selected pair of sets of electrodes.

4. A device as claimed in any one of claims 1 to 3 wherein said capacitance is provided between a selected pair of said sets of electrodes in one cavity for forming an attenuation pole immediately above the high frequency side of the filter passband and further comprising a second capacitance provided between a selected pair of said sets of electrodes in the other cavity for forming an attenuation pole immediately below the low frequency side of the filter passband.

5. A device as claimed in any one of claims 1 to 3 wherein the device comprises a two-resonator device, the means connecting one of said transducers in one cavity with one of said transducers in the other cavity providing a direct electrical connection, the other said transducer in said one cavity being an input transducer for converting input electrical energy supplied to the device into acoustic wave energy, and the other said transducer in said other cavity being an output transducer for converting acoustic wave energy into output electrical energy supplied from the device.

6. A device as claimed in any one of claims 1 to 3 wherein each said reflector comprises a periodic grating structure having a reflective frequency passband and comprising a plurality of discrete discontinuities at said substrate surface, each discontinuity being provided for reflecting a portion of acoustic wave energy incident thereon.

7. A device as claimed in any one of claims 1 to 3 wherein the acoustic waves which the substrate is able to propagate are surface acoustic waves propagating in said surface of that substrate.

8. An acoustic wave resonator device providing a passband filter having a predetermined center frequency comprising, a substrate capable of propagating acoustic waves, a first pair of spaced apart reflectors coupled to the substrate to form a first resonant cavity, a second pair of spaced apart reflectors coupled to the substrate to form a second resonant cavity, said first and second resonant cavities each being capable of supporting an acoustic standing wave in the substrate at said predetermined frequency such that each cavity can be represented as a series resonant equivalent circuit, each cavity including first and second interdigital transducers disposed on a surface of the substrate, means connecting a first transducer of the first cavity to a first transducer of the second cavity thereby to couple energy between the cavities, each transducer including two sets of electrodes with the electrodes of each set electrically connected in common and with the two sets of electrodes of each transducer disposed to couple to opposite phases of the acoustic standing wave energy at said predetermined frequency, means providing a capacitance having a selected capacitance value between a selected set of electrodes of the first transducer and a selected set of electrodes of the second transducer of one cavity thereby to form an attenuation pole at a selected pole frequency on one side of said predetermined frequency.

9. A resonator device as claimed in claim 8 wherein said selected sets of electrodes of the first and second transducers of said one cavity are coupled to opposite phases of acoustic standing wave energy at said predetermined frequency so that said capacitance means forms an equivalent resonant inductance at said pole frequency which forms a parallel resonant circuit with the equivalent circuit capacitance of said cavity at a selected pole frequency on the low frequency side of said predetermined frequency.

10. A resonator device as claimed in claim 8 wherein said selected sets of electrodes of the first and second transducers of said one cavity are coupled to the same phase of acoustic standing wave energy at said predetermined frequency so that said capacitance means forms a parallel resonant circuit with the equivalent circuit inductance of said cavity at a selected pole frequency on the high frequency side of said predetermined frequency.

11. A resonator device as claimed in claim 9 further comprising second means providing a second capacitance having a selected capacitance value between a selected set of electrodes of the first transducer and a selected set of electrodes of the second transducer of the other cavity wherein said selected sets of electrodes of the first and and second transducers of said other cavity are coupled to the same phase of acoustic standing wave energy at said predetermined frequency so that said second capacitance means forms a parallel resonant circuit with the equivalent circuit inductance of said other cavity at a selected pole frequency on the high frequency side of said predetermined frequency.

12. A resonator device as claimed in claims 8, 9, 10 or 11 wherein the second transducer of one cavity comprises an input transducer for converting input electric energy into acoustic wave energy and the second transducer in the other cavity comprises an output transducer for converting acoustic wave energy into output electric energy.

* * * * *